United States Patent
Baker-O'Neal et al.

(10) Patent No.: US 9,911,648 B2
(45) Date of Patent: *Mar. 6, 2018

(54) INTERCONNECTS BASED ON SUBTRACTIVE ETCHING OF SILVER

(71) Applicant: International Business Machines Corporation, Armonk, NY (US)

(72) Inventors: Brett C. Baker-O'Neal, Saratoga Springs, NY (US); Eric A. Joseph, White Plains, NY (US); Hiroyuki Miyazoe, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/347,969

(22) Filed: Nov. 10, 2016

(65) Prior Publication Data
US 2017/0062274 A1 Mar. 2, 2017

Related U.S. Application Data

(63) Continuation of application No. 14/615,077, filed on Feb. 5, 2015, now Pat. No. 9,564,362.

(51) Int. Cl.
*H01L 21/311* (2006.01)
*H01L 21/768* (2006.01)
(Continued)

(52) U.S. Cl.
CPC .... *H01L 21/76892* (2013.01); *H01L 21/0273* (2013.01); *H01L 21/0332* (2013.01); *H01L 21/0337* (2013.01); *H01L 21/32131* (2013.01); *H01L 21/32136* (2013.01); *H01L 21/32139* (2013.01); *H01L 21/76829* (2013.01); *H01L 21/76834* (2013.01); *H01L 21/76843* (2013.01); *H01L 21/76852* (2013.01);
(Continued)

(58) Field of Classification Search
USPC .......................................................... 438/695
See application file for complete search history.

(56) References Cited

U.S. PATENT DOCUMENTS 3,923,568 A 12/1975 Bersin
5,350,484 A 9/1994 Gardner et al.
(Continued)

OTHER PUBLICATIONS

Appendix P—List of IBM Patents or Patent Applications Treated as Related, Filed Nov. 10, 2016, 2 Pages.
Alford, et al.; "Advanced silver-based metallization patterning for ULSI applications"; Elsevier Science B.V.; Microelectronic Engineering; Copyright 2011.
Gao, et al.; "Silver Patterning by Reactive Ion Beam Etching for Microelectronics Application"; Materials Research Society; Symposium Proceedings vol. 812; Symposium held Apr. 13-15, 2004; San Francisco, California, USA.
(Continued)

*Primary Examiner* — Roberts Culbert
(74) *Attorney, Agent, or Firm* — Nicholas L. Cadmus

(57) ABSTRACT

A method for forming at least one Ag or Ag based alloy feature in an integrated circuit, including providing a blanket layer of Ag or Ag based alloy in a multi-layer structure on a substrate. The method further includes providing a hard mask layer over the blanket layer of Ag or Ag based alloy. The method further includes performing an etch of the blanket layer of Ag or Ag based alloy, wherein a portion of the blanket layer of Ag or Ag based alloy that remains after the etch forms one or more conductive lines. The method further includes forming a liner that surrounds the one or more conductive lines. The method further includes depositing a dielectric layer on the multi-layer structure.

16 Claims, 4 Drawing Sheets

(51) Int. Cl.
  *H01L 21/3213* (2006.01)
  *H01L 23/532* (2006.01)
  *H01L 21/027* (2006.01)
  *H01L 21/033* (2006.01)
  *H01L 23/528* (2006.01)

(52) U.S. Cl.
  CPC ...... *H01L 21/76885* (2013.01); *H01L 23/528* (2013.01); *H01L 23/53242* (2013.01); *H01L 23/53247* (2013.01); *H01L 23/53252* (2013.01); *H01L 23/53295* (2013.01)

(56) References Cited

U.S. PATENT DOCUMENTS

| | | |
|---|---|---|
| 6,410,985 B1 | 6/2002 | Chan et al. |
| 6,878,635 B1 | 4/2005 | Nakatani |
| 8,633,117 B1 | 1/2014 | Cabral et al. |
| 9,564,362 B2 * | 2/2017 | Baker-O'Neal .. H01L 21/76892 |
| 2003/0116439 A1 | 6/2003 | Seo et al. |
| 2006/0035173 A1 | 2/2006 | Davidson et al. |
| 2006/0086692 A1 | 4/2006 | Fujimoto et al. |
| 2011/0275220 A1 | 11/2011 | Wu et al. |
| 2012/0038056 A1 | 2/2012 | Cabral, Jr. et al. |
| 2014/0124870 A1 | 5/2014 | Cabral, Jr. et al. |
| 2014/0124935 A1 | 5/2014 | Cabral, Jr. et al. |
| 2014/0127906 A1 | 5/2014 | Cabral, Jr. et al. |
| 2014/0264861 A1 | 9/2014 | Hoinkis et al. |
| 2014/0273437 A1 | 9/2014 | Fuller et al. |

OTHER PUBLICATIONS

IBM, et al.; Silver Metallurgy for Semiconductor Device; An IP.com Prior Art Database Technical Disclosure; Original Publication Date: Oct. 1, 1970; IP.com No. IPCOM000072871D; IP.com Electronic Publication: Feb. 22, 2005.

Hauder, et al.; "Chemical mechanical polishing of silver damascene structures"; Elsevier Science B.V.; Microelectronic Engineering; Copyright 2002.

Hrkut, et al.; "Suitability of N2 Plasma for the Rie Etching of Thin Ag Layers"; Received May 10, 2013; Accepted May 21, 2013.

Jong, et al.; "A Novel Bottom-Up Ag Contact (30nm diameter and 6.5 Aspect Ratio) Technology by Electroplating for 1Xnm and Beyond Technology"; IEEE; Copyright 2011.

Josell, et al.; "Electrical properties of superfilled sub-micrometer silver metallizations"; Journal of applied Physics; vol. 96; No. 1; Jul. 1, 2004; Copyright 2004.

Lee, et al.; "Characteristics of Ag Etching using Inductively Coupled Cl2-based Plasmas"; The Japan Society of Applied Physics; vol. 42; Part 1; No. 1; Jan. 2003; Copyright 2003.

Zeng, et al.; "Processing and encapsulation of silver patterns by using reactive ion etch and ammonia anneal"; Elsevier Science B.V.; Materials Chemistry and Physics; Copyright 2000.

Baker-O'Neal et al., "Interconnects Based on Subtractive Etching of Silver", U.S. Appl. No. 14/615,077, filed Feb. 5, 2015, 28 pages.

* cited by examiner

INTERCONNECTS BASED ON SUBTRACTIVE ETCHING OF SILVER

BACKGROUND OF THE INVENTION

The present invention relates generally to integrated circuits, and more particularly to metal patterning processes for use in manufacturing integrated circuits based on subtractive etching of silver.

Integrated circuits (ICs) commonly use copper interconnects (or "lines") to connect semiconductor devices such as, for example, transistors, on the ICs. These interconnects are typically formed using an additive damascene process in which an interconnect dielectric material is patterned to include at least one opening therein. Copper is subsequently deposited within the opening and thereafter any copper that is located outside the at least one opening can be removed via a planarization process. Successive layers of interconnect dielectric and copper can be formed using such an additive damascene process resulting in a multilayered copper interconnect structure.

Conventional damascene processing such as that described above is not always compatible with the trend toward smaller feature sizes in modern complementary metal oxide semiconductor (CMOS) technology. For instance, modern CMOS technology may require line widths of less than forty nanometers and aspect ratios (i.e., line height to line width) of approximately 2 to 1. Attempting conventional damascene processing within these parameters often results in poor liner/seed coverage on the walls of the openings formed into the interconnect dielectric material, and reentrant profiles. Consequently, the copper filling the at least one opening is subject to voids, defects, and poor adhesion to the liner material. Moreover, as the lines narrow in size, the resistivity of the copper is increased (due to, for example, the thickness of the liner relative to the copper, the small copper grain size, and copper grain boundary and surface scattering phenomena), resulting in decreased IC performance.

SUMMARY

Embodiments of the present invention disclose, a method for forming at least one Ag or Ag based alloy feature in an integrated circuit, including providing a blanket layer of Ag or Ag based alloy in a multi-layer structure on a substrate. The method further includes providing a hard mask layer over the blanket layer of Ag or Ag based alloy. The method further includes performing an etch of the blanket layer of Ag or Ag based alloy, wherein a portion of the blanket layer of Ag or Ag based alloy that remains after the etch forms one or more conductive lines. The method further includes forming a liner that surrounds the one or more conductive lines. The method further includes depositing a dielectric layer on the multi-layer structure.

DETAILED DESCRIPTION

Figure 1:
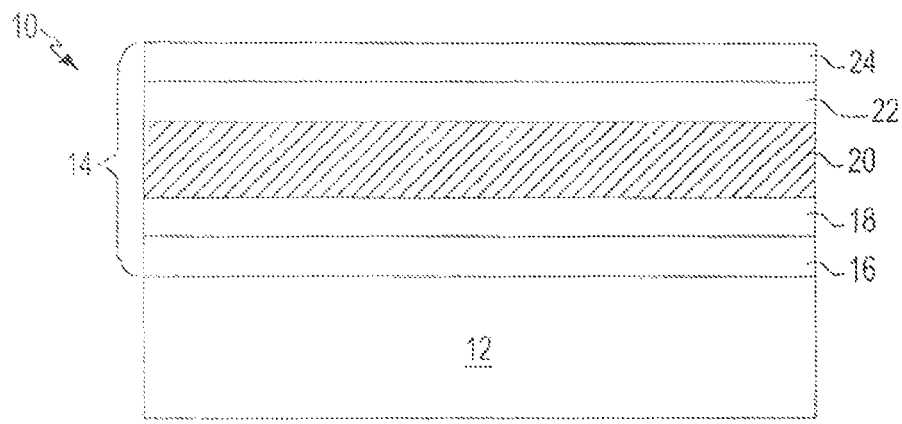
FIG. 1 is a pictorial representation (through a cross sectional view) of a structure including a material stack comprising, from bottom to top, a blanket layer of dielectric material, a blanket layer of a liner material, a blanket layer of metal or metal alloy, a blanket layer of a first hard mask material, and a blanket layer of a second hard mask material, which is located on an upper surface of a substrate.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed present invention, as oriented in the drawing figures. The terms "overlying", "underlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. Also, when an element as a layer, region or substrate is referred to as being "on" or "over" another element, it can be directly on the other element or intervening elements may also be present. In contrast, when an element is referred to as being "directly on" or "directly over" another element, there are no intervening elements present.

Embodiments in accordance with the present invention enable the fabrication of semiconductor structures, i.e., interconnect structures, having small feature sizes (i.e., line widths with less than 40 nm and/or pitches of less than 100 nm. The resultant semiconductor structures are fabricated with minimal damage to the interconnect dielectric material and trenches, which are substantially free of voids and defects. The method in accordance with the present invention also results in maximized grain growth and minimized resistivity in the disclosed semiconductor structures. Furthermore, the use of the plasma etch processes described above in etching exposed portions of the blanket layer of Ag or Ag based alloy minimizes the surface roughening effect of the surface of the remaining portion of the blanket layer of Ag or Ag based alloy as compared to conventional damascene processes, thereby better maintaining the conductivity of the remaining portion of the blanket layer of Ag or Ag based alloy which serves as a conductive feature.

Embodiments in accordance with the present invention will now be described in detail with reference to the figures.

Reference is now made to FIGS. 1-11 which illustrate an embodiment in accordance with the present invention that can be employed in forming a metal or metal alloy feature of an interconnect structure.

Although the description and drawings that are provided herein below form a single conductive feature, the same basic processing steps can be used to form a plurality of conductive features within the same level of the interconnect structure.

Referring first to FIG. 1, there is illustrated a structure 10 including a material stack 14 located on an upper surface of a substrate 12 that can be employed in an illustrative embodiment. Other material stacks can also be used, as long as the material stack includes at least one blanket layer of silver or silver based alloy which can be patterned into a conductive feature using the subtractive plasma etching processes in accordance with the present invention. For the purpose of clarity, several fabrication steps leading up to the production of structure 10 as illustrated in FIG. 1 are omitted. In other words, structure 10 does not start out in the form illustrated in FIG. 1, but may develop into the illustrated structure over several well-known processing steps which are not illustrated but are well-known to those of skill in the art.

In an embodiment in accordance with the present invention, the substrate 12 may be composed of a semiconductor material. Examples of semiconductor materials that may be used as substrate 12 include, but are not limited to, Si, SiGe, SiGeC, SiC, Ge alloys GaAs, InAs, InP, carbon-containing materials such as, for example, carbon nanotubes and graphene, and other III/V or II/VI compound semiconductors. In one embodiment, the semiconductor material which can be employed as substrate 12 may be present in a bulk semiconductor substrate. In another embodiment, the semiconductor material which can be employed as substrate 12 may be a topmost layer of a multilayered semiconductor material stack. In yet another embodiment, the semiconductor material that can be employed as substrate 12 can be a topmost layer of a semiconductor-on-insulator substrate.

In some embodiments, the semiconductor material that can be employed as the substrate 12 can be single crystalline (i.e., a material in which the crystal lattice of the entire sample is continuous and unbroken to the edges of the sample, with no grain boundaries). In another embodiment, the semiconductor material that can be employed as the substrate 12 can be polycrystalline (i.e., a material that is composed of many crystallites of varying size and orientation; the variation in direction can be random (called random texture) or directed, possibly due to growth and processing conditions). In yet another embodiment, the semiconductor material that can be employed as the substrate 12 can be amorphous (i.e., a non-crystalline material that lacks the long-range order characteristic of a crystal). Typically, the semiconductor material that can be employed as substrate 12 is a single crystalline semiconductor material, such as, for example, single crystalline silicon.

The semiconductor material that can be employed as substrate 12 may be doped, undoped or contain doped and undoped regions therein. For clarity, the doped regions are not specifically shown in substrate 12. Each doped region within the semiconductor material may have the same, or they may have different conductivities and/or doping concentrations.

When the substrate 12 comprises a semiconductor material, the semiconductor material can be processed utilizing techniques well known to those skilled in the art to include one or more semiconductor devices such as, for example, transistors, capacitors, diodes, resistors, and BiCMOS devices. For clarity, the one or more semiconductor devices are not shown in the drawings.

In some embodiments, and when substrate 12 is comprised of a semiconductor material, the semiconductor material can be processed to include at least one isolation region therein. For clarity, the at least one isolation region is not shown in the drawings. The at least one isolation region can be a trench isolation region or a field oxide isolation region. The trench isolation region can be formed utilizing a conventional trench isolation process well known to those skilled in the art. For example, lithography, etching and filling of the trench with a trench dielectric such as an oxide may be used in forming the trench isolation region. Optionally, a liner may be formed in the trench prior to trench fill, a densification step may be performed after the trench fill, and a planarization process may follow the trench fill as well. The field oxide isolation region may be formed utilizing a so-called local oxidation of silicon process. Note that the at least one isolation region provides isolation between neighboring gate structure regions, typically required when the neighboring gates have opposite conductivities, i.e., nFETs and pFETs. As such, the at least one isolation region separates an nFET device region from a pFET device region.

In some embodiments, the substrate 12 may be comprised of an insulating material. In such embodiments, the insulating material can be an organic insulator, an inorganic insulator or a combination thereof including multilayers. In one example, substrate 12 may be comprised of glass.

In yet other embodiments, the substrate 12 may be comprised of a conductive material. In such an embodiment, the conductive material may include, for example, polySi (polycrystalline silicon), an elemental metal, alloys of elemental metals, a metal silicide, a metal nitride or combinations thereof including multilayers.

In yet further embodiments, substrate 12 may comprise a combination of an insulating material and a conductive material, wherein the conductive material is embedded therein. In such an embodiment, substrate 12 may represent a lower interconnect level of a multilayered interconnect structure.

As stated above, material stack 14 is located on a surface of substrate 12. In one embodiment in accordance with the present invention, and as shown in FIG. 1, the material stack 14 comprises, from bottom to top, a blanket layer of dielectric material 16, a blanket layer of a liner material 18, a blanket layer of metal or metal alloy 20, a blanket layer of a first hard mask material 22, and a blanket layer of a second hard mask material 24. In some embodiments, the blanket layer of liner material 18 can be omitted from the material stack 14. In such an instance, the material stack 14 would include, from bottom to top, a blanket layer of dielectric material 16, a blanket layer of metal or metal alloy 20, a blanket layer of a first hard mask material 22, and a blanket layer of a second hard mask material 24.

In some embodiments in accordance with the present invention, the blanket layer of dielectric material 16 can be omitted from the material stack 14. In such an instance, the material stack 14 would include, from bottom to top, an optional blanket layer of liner material 18, a blanket layer of metal or metal alloy 20, a blanket layer of a first hard mask material 22, and a blanket layer of a second hard mask material 24.

When present, the blanket layer of dielectric material 16 is composed of an insulating (i.e., dielectric) material such as, for example, silicon dioxide, silicon nitride, silicon oxynitride, undoped silicate glass (USG), fluorosilicate glass (FSG), fluorinated tetraethyl orthosilicate (FTEOS), borophosphosilicate glass (BPSG), a dense or porous spin-on low-k dielectric layer, a dense or porous chemical vapor deposition (CVD) low-k dielectric layer or any combination thereof. The term "low-k" as used throughout the present disclosure denotes a dielectric material that has a dielectric constant of less than silicon dioxide.

The blanket layer of dielectric material 16 can be formed utilizing a conventional deposition process including, for example, chemical vapor deposition (CVD), plasma enhanced chemical vapor deposition (PECVD), evaporation and spin-on coating. The thickness of the blanket layer of dielectric material 16 that can be employed may vary depending on the type of dielectric employed, as well as the method that was employed in forming the same. In one embodiment, the blanket layer of dielectric material 16 can have a thickness from 20 nm to 500 nm. Other thicknesses that are greater or lesser than the range provided above can also be used for the blanket layer of dielectric material 16.

When present, the blanket layer of liner material 18 can be composed of a material that can serve as a barrier to prevent a conductive metal or metal alloy atom from diffusing therethrough. Examples of such barrier materials that can be employed as the blanket layer of liner material 18 include, but are not limited to, cobalt (Co), iridium (Ir), platinum (Pt), palladium (Pd), tantalum (Ta), tantalum nitride (TaN), titanium (Ti), titanium nitride (TiN), manganese (Mn), manganese oxide ($MnO_x$), ruthenium (Ru), ruthenium nitride (RuN), a ruthenium-tantalum alloy (RuTa), ruthenium-tantalum nitride (RuTaN), tungsten (W), tungsten nitride (WN) or any multilayered stack thereof. In one embodiment, the blanket layer of liner material 18 includes Ta, TaN, Ti and/or TiN.

The blanket layer of metal or metal alloy 20 which can be present in material stack 14 includes a conductive metal or metal alloy that can be used as an interconnect (i.e., conductive) feature. The conductive metal or metal alloy that is employed in the present disclosure does not form a volatile species with the underlying layers, particularly, the underlying blanket layer of liner material 18. Also, it is noted that the blanket layer of metal or metal alloy 20 comprises a different material than the material used for the blanket layer of liner material 18.

Illustrative examples of conductive metals that can be employed as the blanket layer of metal or metal alloy 20 include, but are not limited to, silver (Ag), copper (Cu), gold (Au), nickel (Ni), cobalt (Co), aluminum (Al), or any multilayered stack thereof. Conductive metal alloys such as, for example, CuAl can also be employed as the blanket layer of metal or metal alloy 20.

In one embodiment in accordance with the present invention, the blanket layer of metal or metal alloy 20 comprises Ag or an Ag based alloy, such as Ag—Cu, Ag—Mn, Ag—Sn—Cu, Ag—Ti, Ag—Al—Cu, Ag—Al and Ag—Ni. Ag or Ag based alloys offer improved electromigration properties which reduces the resistivity increase due to size effect that becomes substantial for metallization structures below 100 nm in width. Large grain Ag film can be easily obtained by vapor deposition or plating. Ag or Ag based alloys are easier to etch (e.g., by reactive ion etch or RIE) than Cu and its compounds at smaller pitch line-space structure.

The blanket layer of metal or metal alloy 20 can be formed utilizing a conventional deposition process including, for example, chemical vapor deposition (CVD), plasma enhanced chemical vapor deposition (PECVD), atomic layer deposition (ALD), physical vapor deposition, sputtering, chemical solution deposition and plating. The thickness of the blanket layer of metal or metal alloy 20 that can be employed may vary depending on the type of conductive metal or metal alloy employed as well as the method that was employed in forming the same. In one embodiment, the blanket layer of metal or metal alloy 20 can have a thickness from 10 nm to 200 nm. Other thicknesses that are greater or lesser than the range provided above can also be used for the blanket layer of metal or metal alloy 20.

The blanket layer of first hard mask material 22 which can be present in material stack 14 includes a metal mask material. Illustrative examples of metal mask materials that can be employed in the present disclosure as the blanket layer of first hard mask material 22 include, but are not limited to, Ta, TaN, Ti, TiN, W, WN, Ru, niobium (Nb), vanadium (V) or a multilayered stack thereof. The blanket layer of first hard mask material 22 can be formed utilizing a conventional deposition process such as, for example, chemical vapor deposition (CVD), plasma enhanced chemical vapor deposition (PECVD), physical vapor deposition (PVD), sputtering and plating. The thickness of the blanket layer of first hard mask material 22 that can be employed in the present disclosure may vary depending on the type of metal or metal alloy material employed as well as the method that was employed in forming the same. In one embodiment, the blanket layer of first hard mask material 22 can have a thickness from 5 nm to 200 nm. Other thicknesses that are greater or lesser than the range provided above can also be used for the blanket layer of first hard mask material 22.

The blanket layer of second hard mask material 24 which can be present in material stack 14 includes a dielectric hard mask material. Illustrative examples of dielectric hard mask materials that can be employed in the present disclosure as the blanket layer of second hard mask material 24 include, but are not limited to, silicon dioxide, silicon nitride, silicon oxynitride or a multilayered stack thereof. In one embodiment, silicon dioxide is used as the dielectric hard mask material. The blanket layer of second hard mask material 24 can be formed utilizing a conventional deposition process such as, for example, chemical vapor deposition (CVD), plasma enhanced chemical vapor deposition (PECVD), evaporation, chemical solution deposition, physical vapor deposition (PVD) and atomic layer deposition (ALD). The thickness of the blanket layer of second hard mask material 24 that can be employed may vary depending on the type of dielectric material employed as well as the method that was employed in forming the same. In one embodiment, the blanket layer of second hard mask material 24 can have a thickness from 5 nm to 200 nm. Other thicknesses that are greater or lesser than the range provided above can also be used for the blanket layer of second hard mask material 24.

Figure 2:
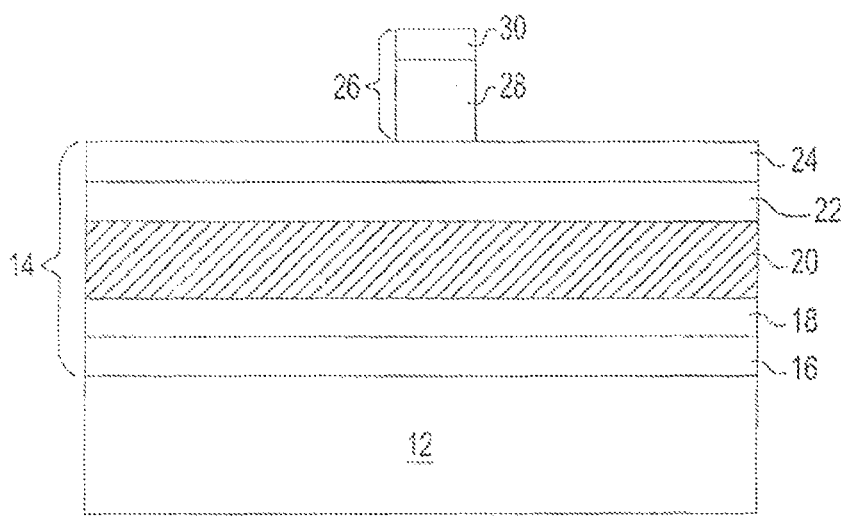
FIG. 2 is a pictorial representation (through a cross sectional view) of the structure of FIG. 1 after forming a patterned mask atop the blanket layer of second hard mask material.

Referring now to FIG. 2, there is illustrated the structure 10 of FIG. 1 after forming a patterned mask 26 atop a topmost surface of the material stack 14, i.e., on the surface of the blanket layer of second hard mask material 24. The patterned mask 26 that is employed may include, from bottom to top, an organic underlayer 28 and a resist layer 30. As shown, the organic underlayer 28 has sidewalls that are vertically coincident to sidewalls of the resist layer 30.

The organic underlayer 28 that can be employed in various embodiments in accordance with the present invention may include near frictionless carbon (NFC), any organic planarizing layer (OPL), or photoresist. In one embodiment in which the organic underlayer is an OPL, the OPL can include a non-photosensitive organic polymer including carbon, hydrogen, oxygen, and optionally fluorine. For example, the OPL can include hydrocarbons and/or hydrofluorocarbons. Additional possibilities for the OPL material include, but are not limited, to diamond like carbon (DLC), thermosetting polyarylene ethers, amorphous carbon materials, poly(stryenes), poly(esters), poly(methacrylates), poly(acrylates), poly(glycols), poly(amides), poly(norbornenes), or combinations thereof. The organic underlayer 28 can be first formed as a blanket layer atop the blanket layer of second hard mask material 24 by utilizing a deposition process such as, for example, spin-coating, dip coating, brush coating, blade coating, and chemical solution deposition. The thickness of the organic underlayer 28 can be from 20 nm to 500 nm, although lesser and greater thicknesses can also be employed.

The resist layer 30 may include a photosensitive resist or an electron beam sensitive resist. In one embodiment, the resist layer 30 is comprised of a siloxane such as, for example, a silsesquioxane. An example of a silsesquioxane that can be employed as resist layer 30 includes hydrogen silsesquioxane. In one embodiment, the resist layer 30 can be a negative tone-resist material. The resist layer 30 can be first formed as a blanket layer atop the blanket layer of organic underlayer 28 by utilizing a deposition process such as, for example, spin-coating, dip coating, brush coating, blade coating, and chemical solution deposition. The thickness of the resist layer 30 can be from 10 nm to 200 nm, although lesser and greater thicknesses can also be employed.

The blanket layer of resist material is then lithographically patterned into a predetermined shape forming resist layer 30. In one embodiment in accordance with the present invention, lithographic patterning of the blanket layer of resist material may include optical lithography. In another embodiment, lithographic patterning of the blanket layer of resist material may include electron beam lithography, such as, for example, direct write electron beam lithography. After lithographically patterning the blanket layer of resist material forming resist layer 30, the pattern within the resist layer 30 can be transferred to the blanket layer of organic underlayer material forming organic underlayer 28. In one embodiment, the transfer of the pattern from resist layer 30 into the blanket layer of organic underlayer material includes an anisotropic etch.

Figure 3:
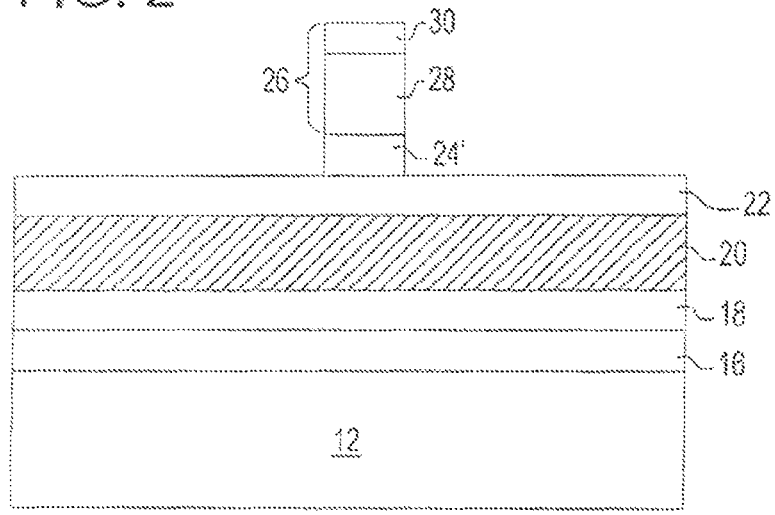
FIG. 3 is a pictorial representation (through a cross sectional view) of the structure of FIG. 2 after patterning the blanket layer of second hard mask material using the patterned mask as a first etch mask.

Referring to FIG. 3, there is illustrated the structure of FIG. 2 after patterning the blanket layer of second hard mask material 24 using the patterned mask 26 as a first etch mask. The remaining portion of the blanket layer of second hard mask material which is not removed during this step is designated in the drawings as element 24'. The patterning of the blanket layer of second hard mask material 24 can include a dry etching process such as, for example, reactive ion etching, plasma etching, or ion beam etching. As shown, the remaining portion of the blanket layer of second hard mask material 24' has sidewalls that are vertically coincident to that of the patterned mask 26.

Figure 4:
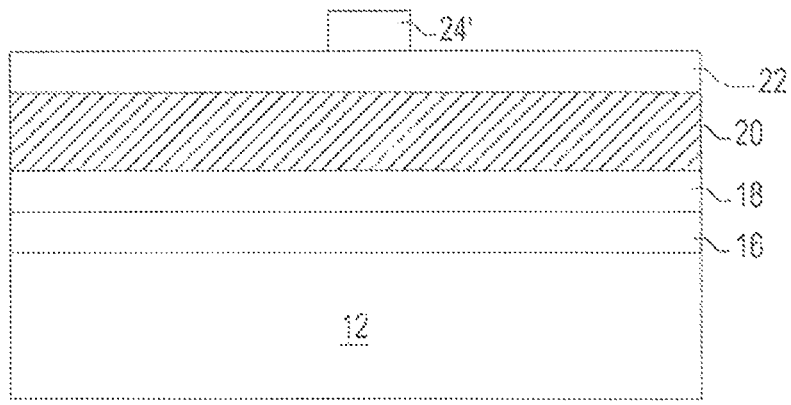
FIG. 4 is a pictorial representation (through a cross sectional view) of the structure of FIG. 3 after removing the patterned mask from the structure.

Referring now to FIG. 4, there is illustrated the structure of FIG. 3 after removing the patterned mask 26, i.e., the resist layer 30 and the organic underlayer 28, from the structure, leaving the remaining portion of the blanket layer of second hard mask material 24' atop the blanket layer of first hard mask material 22. The removal of the patterned mask 26 can be achieved utilizing any conventional process that is capable of removing a resist material and an organic underlayer material from a structure. In one embodiment, the resist layer 30 can be removed by an ashing process, and the organic underlayer 28 can be removed by an ashing process.

Figure 5:
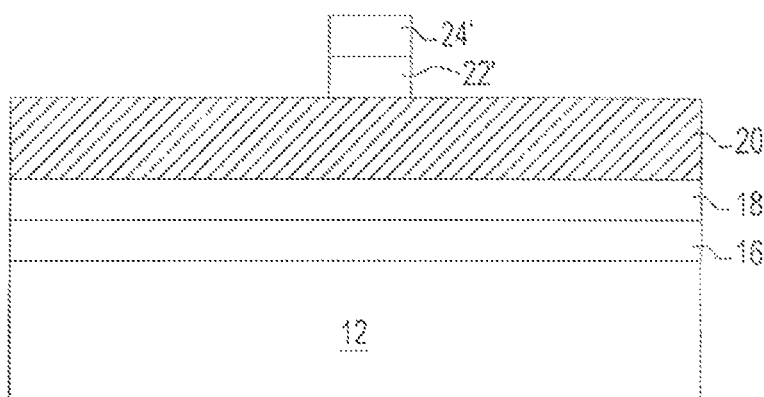
FIG. 5 is a pictorial representation (through a cross sectional view) of the structure of FIG. 4 after patterning the blanket layer of first hard mask material using the remaining portion of the blanket layer of second hard mask material as a second etch mask.

Referring now to FIG. 5, there is illustrated the structure of FIG. 4 after patterning the blanket layer of first hard mask material 22 using the remaining portion of the blanket layer of second hard mask material 24' as a second etch mask. The remaining portion of the blanket layer of first hard mask material which is not removed during this step is designated in the drawings as element 22'. The patterning of the blanket layer of first hard mask material 22 can include a dry etching process such as, for example, reactive ion etching, plasma etching, or ion beam etching. As shown, the remaining portion of the blanket layer of first hard mask material 22' has sidewalls that are vertically coincident to that of the remaining portion of the blanket layer of second hard mask material 24'.

In another embodiment, the patterning of the blanket layer of first hard mask material 22 uses chlorine and fluorine etch chemistry in a two-step process to control the patterning of hard masks on Ag or Ag based alloy conductive metal. The two-step process allows for easier control of the hard mask profile during subtractive Ag and Ag based alloy etching, as well as easier control of Ag or Ag based alloy patterning.

The two-step etch process is next used to transfer the pattern from the remaining portion of the blanket layer of second hard mask material 24' to the blanket layer of first hard mask material 22. In one embodiment, a first, chlorine-based plasma or sulfur fluoride-based plasma sputter etch process (e.g., using diatomic chlorine ($Cl_2$) plasma, chlorine and sulfur tetrafluoride ($SF_4$) plasma, chlorine and sulfur hexafluoride ($SF_6$) plasma, or another chlorine-based plasma or sulfur fluoride-based plasma) is used to remove a portion of the blanket layer of first hard mask material 22. This can be achieved using any plasma system used for semiconductor device prototyping or fabrication. For instance, medium to high density (i.e., plasma densities>approximately $10^8$ $cm^{-3}$) and low electron temperature $T_e$ (i.e., $T_e$< approximately 10 eV) systems can be used; however, a high source density and low ion energy system will typically be used. Such systems include, but are not limited to: inductively coupled plasma (ICP) systems, electron cyclotron resonance (ECR) systems, helicon systems, dual frequency capacitive (DFC) systems, helical resonator systems, and microwave-generated discharge systems. Additionally, low ion energies are characterized by any of the above-described systems in which radio frequency (RF) power is coupled to the platen/substrate using frequencies less than approximately 100 MHz and power less than approximately 2000 W.

The first sputter etch step results in the blanket layer of first hard mask material 22 being etched a portion of the way down to the blanket layer of metal or metal alloy 20; however, at least a thin coating of the blanket layer of first hard mask material 22 remains over the regions of the blanket layer of metal or metal alloy 20 that do not reside directly beneath the remaining portion of the blanket layer of second hard mask material 24'. In one embodiment, the first sputter etch step etches the blanket layer of first hard mask material 22 at a first etch rate.

A second sputter etch step is performed using a second plasma chemistry. In one embodiment, the second plasma chemistry is a fluorocarbon-based plasma (e.g., using tetrafluoromethane ($CF_4$) or another fluorocarbon-based plasma). The second sputter etch/metal surface modification step removes the thin coating of the blanket layer of first hard mask material 22 that remains after the first sputter etch step (i.e., the portions of the blanket layer of first hard mask material 22 that do not reside directly beneath the remaining portion of the blanket layer of second hard mask material 24'), thereby exposing the blanket layer of metal or metal alloy 20. In one embodiment, the second sputter etch step etches the blanket layer of first hard mask material 22 at a second etch rate different from the first etch rate (e.g., the second etch rate may be slower than the first etch rate). Thus, after the two-step plasma etch process (i.e., the first, chlorine-based plasma or sulfur fluoride-based plasma etch followed by the second, fluorocarbon-based plasma etch), the exposed portions of the blanket layer of first hard mask material 22 are etched down to the blanket layer of metal or metal alloy 20. In addition, the second sputter etch step completely etches/removes the blanket layer of first hard mask material 22. The second sputter/metal surface modification etch step thus provides a soft landing for the etch of the blanket layer of metal or metal alloy 20.

Figure 6:
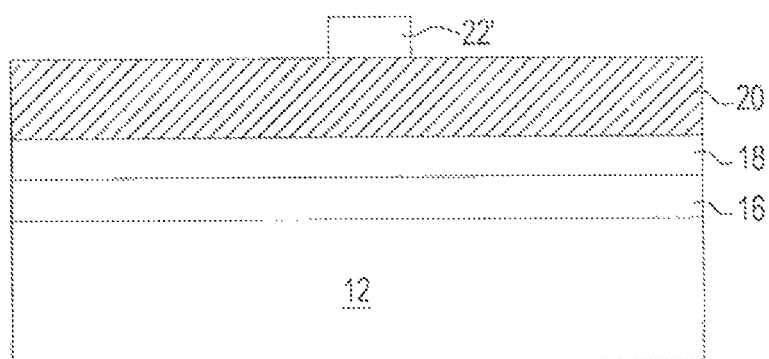
FIG. 6 is a pictorial representation (through a cross sectional view) of the structure of FIG. 5 after removing the remaining portion of the blanket layer of second hard mask material from the structure.

Referring now to FIG. 6, there is illustrated the structure of FIG. 5 after removing the remaining portion of the blanket layer of second hard mask material 24' from the structure, leaving the remaining portion of the first hard mask material 22' atop the blanket layer of metal or metal alloy 20. In one embodiment, the removal of the remaining portion of the blanket layer of second hard mask material 24' from the structure can include a planarization process such as, for example, chemical mechanical polishing and/or grinding. In another embodiment, a wet etch can be used to remove the remaining portion of the blanket layer of second hard mask material 24' from the structure. An example of a wet etch process that can be used to remove the remaining portion of the blanket layer of second hard mask material 24' includes a diluted HF solution.

Figure 7:
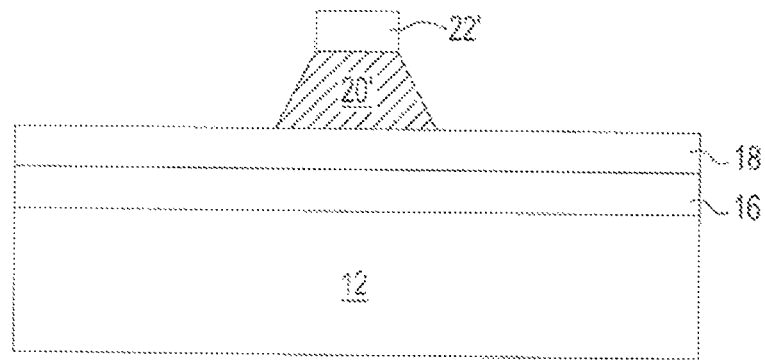
FIG. 7 is a pictorial representation (through a cross sectional view) of the structure of FIG. 6 after patterning the blanket layer of metal or metal alloy using the remaining portion of the blanket layer of first hard mask material as a third etch mask.

Referring now to FIG. 7, there is illustrated the structure of FIG. 6 after patterning the blanket layer of metal or metal alloy 20 using the remaining portion of the blanket layer of first hard mask material 22' as a third etch mask.

In one embodiment, a methanol ($CH_3OH$) plasma sputter etch process is used to remove the exposed portions of the blanket layer of metal or metal alloy 20 that are not protected by the remaining portion of the first hard mask material 22'. This process comprises a single etch step using the methanol plasma.

In another embodiment, a two-step etch using two different plasma chemistries is used to remove the exposed portions of the blanket layer of metal or metal alloy 20 that are not protected by the remaining portion of the first hard mask material 22'.

A first sputter etch step is performed using methanol plasma. This can be achieved using any plasma system used for semiconductor device prototyping or fabrication. For instance, medium to high density (i.e., plasma densities> approximately $10^8$ $cm^{-3}$) and low electron temperature $T_e$ (i.e., $T_e$<approximately 10 eV) systems can be used; however, a high source density and low ion energy system will typically be used. Such systems include, but are not limited to: inductively coupled plasma (ICP) systems, electron cyclotron resonance (ECR) systems, helicon systems, dual frequency capacitive (DFC) systems, helical resonator systems, and microwave-generated discharge systems. Additionally, low ion energies are characterized by any of the above-described systems in which radio frequency (RF) power is coupled to the platen/substrate using frequencies less than approximately 100 MHz and power less than approximately 2000 W. The first etch step removes a first portion of the exposed portions of the blanket layer of metal or metal alloy 20 that are not protected by the remaining portion of the first hard mask material 22'. In one embodiment, the first sputter etch step removes the exposed portions of the blanket layer of metal or metal alloy 20 that are not protected by the remaining portion of the first hard mask material 22' at a first etch rate (e.g., approximately one hundred nanometers per minute).

A second sputter etch step is performed using a second plasma chemistry. In one embodiment, the second plasma chemistry is a pure helium (He) plasma. Alternatively, this discharge can comprise any chemically inert gas with a high ultraviolet/vacuum ultraviolet (UV/VUV) emissivity, including, but not limited to: krypton (Kr), argon (Ar), xenon (Xe), hydrogen plasma ($H_2$), or combinations thereof, operating under low ion energy conditions as described above. The second sputter etch/metal surface modification step removes a second portion of the exposed portions of the blanket layer of metal or metal alloy 20 that are not protected by the remaining portion of the first hard mask material 22'. In one embodiment, the second sputter etch step removes the exposed portions of the blanket layer of metal or metal alloy 20 that are not protected by the remaining portion of the first hard mask material 22' at a second etch rate that is lower than the first etch rate (e.g., approximately ten nanometers per minute). Thus, after the two-step plasma etch process, the exposed portions of the blanket layer of metal or metal alloy 20 that are not protected by the remaining portion of the first hard mask material 22' are etched down to the uppermost surface of the blanket layer of liner material 18.

The second sputter/metal surface modification etch step provides a soft landing for the etch of the blanket layer of metal or metal alloy 20. Helium plasma is a good process plasma to use in the second etch step because its characteristics (e.g., lighter ion mass and high VUV emissions compared to other plasma gases) result in increased etch selectivity to the organic materials in the structure 10. In particular, the high VUV emissions (e.g., approximately twenty electron volts at a wavelength of around sixty nanometers) can increase the etch resistances of the organic/inorganic and low-k/ultra-low-k dielectric materials and allow these materials to be cured (typically through increased cross linking and/or elimination of reactive dangling bonds). This controls the roughness of the metal lines. The lighter ion mass of the helium increases the etch selectivity against materials not being removed, leads to less damage to low-k/ultra-low-k dielectric materials, and improves the time-dependent dielectric breakdown.

In yet another embodiment, the exposed portions of the blanket layer of metal or metal alloy 20 that are not protected by the remaining portion of the first hard mask material 22' can be removed utilizing a plasma etching process in which a plasma that is capable of forming a polymeric compound and/or complex on remaining, e.g., non-etched, portions of the blanket layer of metal or metal alloy is used as a metal or metal alloy etchant. In one embodiment, the plasma etch can be performed at nominal room temperature. By "nominal room temperature" it is meant a temperature from 15° C. to 80° C. The plasma etch that can be employed in an embodiment in accordance with the present invention is also performed at a pressure of less than 100 mTorr. Pressures above 100 mTorr are undesirable since it may result in an excess build up of a polymeric compound and/or complex on the unetched portion of the blanket layer of metal or metal alloy 20, which, if too thick, is difficult to remove. In one embodiment, the plasma etch is performed at a pressure from 1 mTorr to 50 mTorr.

The plasma that can be employed during the plasma etch can be generated from a hydrocarbon-containing precursor which may or may not include oxygen. Thus, oxygen is an optional component. In one embodiment, the plasma etch can be performed by using a mixture of a hydrocarbon-containing precursor and oxygen. In such instances, a single etch step can be employed. In another embodiment, the plasma etch can be performed utilizing alternating pulses of a hydrocarbon-containing precursor and oxygen. In such instances, at least two etch steps can be employed. Typically, the last pulse of any sequence of pulses includes oxygen. In embodiments in which a hydrocarbon plasma is used, a polymeric hydrocarbon containing compound and/or complex can form on non-etched portions of the blanket layer of metal or metal alloy 20. In embodiments in which a hydrocarbon and oxygen plasma is used, a polymeric compound and/or complex containing C, H, and O can form on non-etched portions of the blanket layer of metal or metal alloy 20.

When a hydrocarbon-containing precursor is employed, the hydrocarbon-containing precursor that can be employed is an organic compound that consists entirely of hydrogen and carbon. The hydrocarbon-containing precursor that can be employed can be an alkane (i.e., a compound having the formula $C_nH_{2n+2}$ wherein n is from 1 to 20 carbon atoms), an alkene (i.e., a compound having the formula $C_nH_{2n}$ wherein n is from 2 to 20 carbon atoms), an alkyne (i.e., a compound having the formula $C_nH_{2n-2}$ wherein n is from n is from 2 to 20 carbon atoms), a cycloalkane (i.e., a compound containing one or more carbon rings to which hydrogen atoms are attached and generally having the formula $C_nH_{2n}$ wherein n is from 3 to 12 carbon atoms), and/or an arene (i.e., a compound having one or more aromatic rings). In one embodiment, the hydrocarbon-containing precursor that can be employed includes an alkene having from 2 to 12 carbon atoms. In one example, the alkene is ethylene. In one embodiment, the ratio of hydrocarbon-containing precursor to oxygen that is used during the plasma etch is from 1:0 to 1:10; at 0 no oxygen is present. In another embodiment, the ratio of hydrocarbon-containing precursor to oxygen that is used during the plasma etch is from 10:1 to 1:10.

In other embodiments, the plasma that can be used during the plasma etch can be generated by using CO and optionally hydrogen. In one embodiment, the CO and hydrogen can be used as a mixture. In such instances, the plasma etch can be performed in a single step. In another embodiment, the CO and hydrogen can be added in separate pulses. In such instances, the plasma etch can be performed in at least two steps. Typically, the last pulse of any sequence of pulses includes CO. In embodiments in which a CO plasma is used, a polymeric compound and/or complex containing C and O can form on non-etched portions of the blanket layer of metal or metal alloy 20. In embodiments in which a CO and hydrogen plasma is used, a polymeric compound and/or complex containing C, O, and H can form on non-etched portions of the blanket layer of metal or metal alloy 20. In one embodiment, the ratio of CO to hydrogen that is used during the plasma etch is from 10:0 to 1:10; at 0 no hydrogen is present.

In yet other embodiments, the plasma that can be employed during the plasma etch can be generated by using $CO_2$ and optionally hydrogen. In one embodiment, the $CO_2$ and hydrogen can be used as a mixture. In such instances, the plasma etch can be performed in a single step. In another embodiment, the $CO_2$ and hydrogen can be added in separate pulses. In such instances, the plasma etch can be performed in at least two steps. Typically, the last pulse of any sequence of pulses includes $CO_2$. In embodiments in which a $CO_2$ plasma is used, a polymeric compound and/or complex containing C and O can form on non-etched portions of the blanket layer of metal or metal alloy 20. In embodiments in which a $CO_2$ and hydrogen plasma is used, a polymeric compound and/or complex containing C, O, and H can form on non-etched portions of the blanket layer of metal or metal alloy 20. In one embodiment, the ratio of $CO_2$ to hydrogen that is used during the plasma etch is from 10:0 to 1:10; at 0 no hydrogen is employed. In another embodiment, the ratio of $CO_2$ to hydrogen that is used during the plasma etch is from 10:1 to 1:10.

During the plasma etching of the blanket layer of metal or metal alloy 20, the plasma generates a polymeric compound and/or complex which builds up on the sidewalls of the portion of the blanket layer of metal or metal alloy 20 that are located directly beneath the remaining portion of the blanket layer of first hard mask material 22'. The built up polymeric compound and/or complex protects the sidewalls of the portion of the blanket layer of metal or metal alloy 20 that are located directly beneath the remaining portion of the blanket layer of first hard mask material 22' from being damaged during the plasma etch. The built up polymeric compound and/or complex can be removed during the plasma etching process by providing excessive oxygen species with the same. In one embodiment, the polymeric compound and/or complex can consist of C and H. In another embodiment, the polymeric compound and/or complex can consist of C and O. In another embodiment, the polymeric compound and/or complex can consist of C, H, and O.

In the embodiment illustrated, the blanket layer of metal or metal alloy 20 is etched down to the uppermost surface of the blanket layer of liner material 18, except for portions that are located directly beneath the remaining portion of the first hard mask material 22'. The remaining portion of the blanket layer of metal or metal alloy (designated as element 20' in the drawings) forms a conductive feature, i.e., conductive line or conductive via. In one embodiment (not shown, but which can be readily deduced from the drawings of the present application), the remaining portion of the blanket layer of metal or metal alloy 20' has sidewalls that are vertically coincident to sidewalls of the remaining portion of the first hard mask material 22'. In another embodiment, and as shown in the drawings, the remaining portion of the metal or metal alloy 20' has a substantially pyramidal profile having, for example, a sidewall taper of approximately from 85 to 90 degrees. In the specific embodiment illustrated, the height of the remaining portion of the metal or metal alloy 20' is greater than the widest portion of the remaining portion of the metal or metal alloy 20', i.e., the base of the remaining portion of metal or metal alloy 20'.

Figure 8:
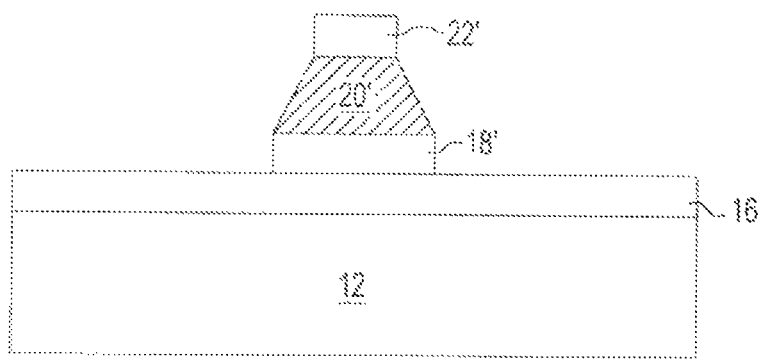
FIG. 8 is a pictorial representation (through a cross sectional view) of the structure of FIG. 7 after etching the blanket layer of liner material using the remaining portion of the blanket layer of first hard mask material and the remaining portion of the blanket layer of metal or metal alloy as a fourth etch mask.

Referring now to FIG. 8, there is illustrated the structure of FIG. 7 after etching the blanket layer of liner material 18 using the remaining portion of the blanket layer of first hard mask material 22' and the remaining portion of the blanket layer of metal or metal alloy 20' as a fourth etch mask. The remaining portion of the blanket layer of liner material which is designated as element 18' in the drawings lies beneath the remaining portion of the metal or metal alloy 20' and forms the base of the "trenches" that immediately surround the remaining portion of the metal or metal alloy 20'. The etch used to remove the portions of the blanket layer of liner material 18 that are not protected by the remaining portion of the metal or metal alloy 20' comprises an anisotropic etch.

Figure 9:
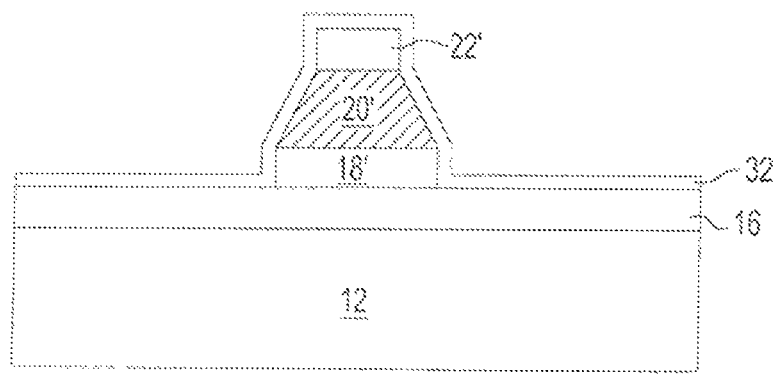
FIG. 9 is a pictorial representation (through a cross sectional view) of the structure of FIG. 8 after forming a liner material on all exposed surfaces of the structure shown in FIG. 8.

Referring now to FIG. 9, there is illustrated the structure of FIG. 8 after forming a liner material 32 on all exposed surfaces of the structure shown in FIG. 8. The liner material 32 can include any material that can serve as a barrier to prevent conductive metal ions from diffusing into an interconnect dielectric material to be subsequently formed. Examples of materials that can be used as liner material 32 include, for example, cobalt (Co), iridium (Ir), platinum (Pt), palladium (Pd), tantalum (Ta), tantalum nitride (TaN), titanium (Ti), titanium nitride (TiN), manganese (Mn), manganese oxide ($MnO_x$), ruthenium (Ru), ruthenium nitride (RuN), a ruthenium-tantalum alloy (RuTa), ruthenium-tantalum nitride (RuTaN), tungsten (W), tungsten nitride (WN) or any multilayered stack thereof.

In one embodiment, the liner material 32 may comprise a same liner material as the blanket layer of liner material 18. In another embodiment, the liner material 32 may comprise a different liner material as the blanket layer of liner material 18.

The liner material 32 can be formed by a deposition process including, for example, chemical vapor deposition (CVD), plasma enhanced chemical vapor deposition (PECVD), atomic layer deposition (ALD), physical vapor deposition (PVD), sputtering and plating. The thickness of the liner material 32 may vary depending on the deposition process used as well as the material employed. In one embodiment, the liner material 32 can have a thickness from 1 nm to 40 nm. Other thicknesses that are greater or lesser than the range provided above can also be used for the liner material 32.

Figure 10:
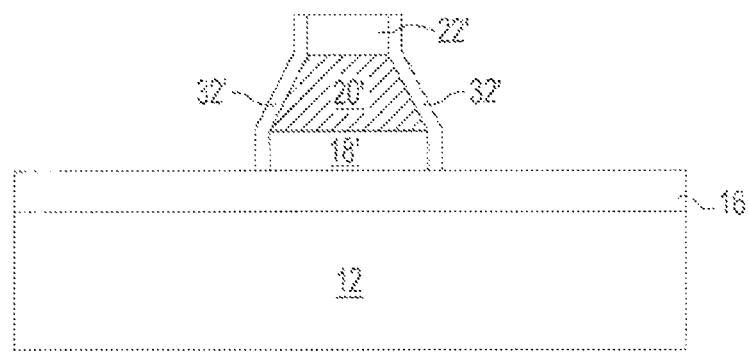
FIG. 10 is a pictorial representation (through a cross sectional view) of the structure of FIG. 9 after removing all horizontal portions of the liner material from the structure.

Referring now to FIG. 10, there is illustrated the structure of FIG. 9 after removing all horizontal portions of the liner material 32 from the structure. The remaining liner material, which is present on the sidewalls of the remaining portion of the blanket layer of metal or metal alloy 20' and the sidewalls of the remaining portion of the blanket layer of liner material 18, can be referred to herein as a liner material 32'. The horizontal portions of the liner material 32 can be removed utilizing a directional etching process such as, for example, a reactive ion etching process or ion beam sputtering using noble gases.

Figure 11:
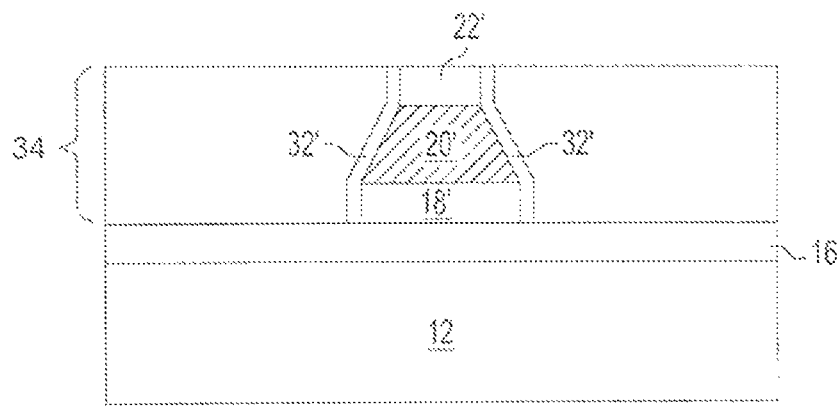
FIG. 11 is a pictorial representation (through a cross sectional view) of the structure of FIG. 10 after forming an interconnect dielectric material and performing a planarization process.

Referring now to FIG. 11, there is illustrated the structure of FIG. 10 after forming an interconnect dielectric material 34 and performing a planarization process. The planarization process results in a structure in which the interconnect dielectric material 34 has an uppermost surface that is coplanar with the uppermost surface of the remaining portion of the blanket layer of first hard mask material 22'. In the structure, the remaining portion of the blanket layer of first hard mask material 22' can serve as a metal cap for the remaining portion of the blanket layer of metal or metal alloy 20'. The remaining portion of the blanket layer of metal or metal alloy 20' represents the conductive feature of an interconnect structure and is embedded within the interconnect dielectric material 34. Sidewall surfaces of the remaining portion of the blanket layer of metal or metal alloy 20' are separated from the interconnect dielectric 34 by diffusion barrier liner 32'.

The interconnect dielectric material 34 that can be employed in various embodiments in accordance with the present invention may include any interlevel or intralevel dielectric material including inorganic dielectrics or organic dielectrics. The interconnect dielectric material 34 may be porous, non-porous or contain regions and/or surfaces that are porous and other regions and/or surfaces that may be non-porous. Some examples of suitable dielectrics that can be used as the interconnect dielectric material 34 include, but are not limited to, silsesquioxanes, C doped oxides (i.e., organosilicates) that include atoms of Si, C, O, and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In one embodiment, the interconnect dielectric material 34 has a dielectric constant that is less than silicon dioxide, i.e., less than 4.0. In another embodiment, the interconnect dielectric material 34 that can be employed in the present disclosure has a dielectric constant of 3.0 or less. All dielectric constants mentioned herein are relative to a vacuum, unless otherwise noted. Dielectrics which have a dielectric constant of less than that of silicon dioxide generally have a lower parasitic cross talk as compared with dielectric materials that have a higher dielectric constant equal to, or greater than, silicon dioxide. Generally, silicon dioxide has a dielectric constant of 4.0.

The thickness of the interconnect dielectric material 34 may vary depending upon the composition of the dielectric material used as well as the exact number of dielectric layers within the interconnect dielectric material 34. In one embodiment, the interconnect dielectric material 34 can have a thickness from 50 nm to 1000 nm. In other embodiments, the interconnect dielectric material 34 can have a thickness that is greater than or less than the thickness range mentioned above. The interconnect dielectric material 34 can be formed utilizing a deposition process such as, for example, chemical vapor deposition (CVD), plasma enhanced chemical vapor deposition (PECVD), evaporation, chemical solution deposition and spin-on coating.

In some embodiments, the planarization process employed in forming the structure shown in FIG. 11 includes chemical mechanical polishing and/or grinding. In other embodiments, an etch back process can be used to provide the planar structure shown in FIG. 11.

The descriptions of the various embodiments in accordance with the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming at least one Ag or Ag based alloy feature in an integrated circuit, the method comprising:
    providing a blanket layer of Ag or Ag based alloy in a multi-layer structure on a substrate; and
    performing an etch of the blanket layer of Ag or Ag based alloy, wherein a portion of the blanket layer of Ag or Ag based alloy that remains after the etch forms one or more conductive lines, and wherein the etch of the blanket layer of Ag or Ag based alloy is performed using a plasma that is capable of forming a polymeric compound and/or complex on the portion of the blanket layer of Ag or Ag based alloy that remains after the etch.

2. The method of claim 1, wherein each of the one or more conductive lines has a width of less than approximately fifty nanometers.

3. The method of claim 1, wherein a pitch between at least two conductive lines of the one or more conductive lines is less than approximately one hundred nanometers.

4. The method of claim 1, wherein the multi-layer structure comprises:
    a first dielectric layer formed on the substrate;
    a first liner layer formed on the first dielectric layer;
    the blanket layer of Ag or Ag based alloy formed on the first liner layer;
    a hard mask layer formed on the blanket layer of Ag or Ag based alloy;
    an organic underlayer formed on the hard mask layer; and
    a resist layer formed on the organic underlayer.

5. The method of claim 4, wherein the hard mask layer comprises a first hard mask layer and a second hard mask layer formed on the first hard mask layer.

6. The method of claim 5, wherein the first hard mask layer comprises tantalum.

7. The method of claim 5, further comprising, prior to performing the etch:
    transferring a pattern from the organic underlayer and the second hard mask layer to the first hard mask layer.

8. The method of claim 7, wherein the transferring comprises:
    developing the resist layer;
    etching the second hard mask layer down to the first hard mask layer, such that only a portion of the second hard mask layer residing directly beneath the organic underlayer remains and becomes a patterned second hard mask layer;
    removing the organic underlayer and the resist layer;
    exposing the patterned second hard mask layer; and
    etching the first hard mask layer down to the blanket layer of Ag or Ag based alloy, such that only a portion of the first hard mask layer residing directly beneath the patterned second hard mask layer metal remains and becomes a patterned first hard mask layer.

9. The method of claim 1, wherein the etch of the blanket layer of Ag or Ag based alloy is performed using the plasma is performed at a temperature between 15 degrees Celsius and 80 degrees Celsius.

10. The method of claim 1, wherein the etch of the blanket layer of Ag or Ag based alloy is performed using the plasma at a pressure less than 100 mTorr.

11. The method of claim 1, wherein the plasma is generated from a hydrocarbon-containing precursor, wherein the hydrocarbon-containing precursor is an organic compound that consists entirely of hydrogen and carbon.

12. The method of claim 11, wherein the hydrocarbon-containing precursor is one of: an alkane, an alkene, an alkyne, a cycloalkane, and an arene.

13. The method of claim 1, wherein the plasma is generated from a generated from CO and hydrogen.

14. The method of claim 1, wherein the plasma is generated from a generated from $CO_2$ and hydrogen.

15. The method of claim 1, further comprising:
    forming a liner that surrounds the one or more conductive lines; and
    depositing a dielectric layer on the multi-layer structure.

16. The method of claim 1, wherein the etch of the blanket layer of Ag or Ag based alloy is performed using a two-step etch process, wherein a first step of the two-step etch process removes a first portion of the blanket layer of Ag or Ag based alloy at a first etch rate, and wherein a second step of the two-step etch process removes a second portion of the blanket layer of Ag or Ag based alloy at a second etch rate.

* * * * *